United States Patent [19]

Koch et al.

[11] 4,233,527
[45] Nov. 11, 1980

[54] CHARGE INJECTION DEVICE OPTO-ELECTRONIC SENSOR

[75] Inventors: Rudolf Koch, Munich; Hans-Joerg Pfleiderer, Zorneding, both of Fed. Rep. of Germany

[73] Assignee: Siemens Aktiengesellschaft, Berlin & Munich, Fed. Rep. of Germany

[21] Appl. No.: 696,478

[22] Filed: Jun. 16, 1976

[30] Foreign Application Priority Data

Jun. 20, 1975 [DE] Fed. Rep. of Germany ....... 2527626

[51] Int. Cl.³ .................. H03K 3/42; H01L 29/78; H01L 27/14; H01L 31/00
[52] U.S. Cl. .................................. 307/311; 357/24; 357/30; 250/211 J
[58] Field of Search ............... 357/24, 30; 307/221 D, 307/235 B, 235 C, 311; 250/211 J

[56] References Cited

U.S. PATENT DOCUMENTS

| | | | |
|---|---|---|---|
| 3,676,715 | 7/1972 | Brojdo | 357/30 |
| 3,781,574 | 12/1973 | White | 357/24 |
| 3,805,062 | 4/1974 | Michon et al. | 357/24 |
| 3,808,476 | 4/1974 | McCann | 357/24 |
| 3,882,531 | 5/1975 | Michon et al. | 357/24 |
| 3,934,161 | 1/1976 | Caywood | 307/221 D |
| 3,935,446 | 1/1976 | Michon | 250/211 J |
| 3,969,636 | 7/1976 | Baertsch et al. | 307/221 D |

OTHER PUBLICATIONS

Graeme et al., Eds., *Operational Amplifiers: Design and Applications*, McGraw-Hill, 1971, pp. 233-235.
Jespers et al., "A Three-Terminal Charge-Injection Device", IEEE Int. Solid-State Circuits Conf. (2/75), Dig. Tech. Papers, pp. 28-29.
Jespers et al., "Three-Terminal Charge-Injection Device", IEEE J. Solid-State Circuits, vol. SC-11 (2/76), pp. 133-139.

*Primary Examiner*—Gene M. Munson
*Attorney, Agent, or Firm*—Hill, Van Santen, Steadman, Chiara & Simpson

[57] ABSTRACT

An opto-electronic sensor has at least one light-permeable electrically insulating layer carried on a surface of a substrate of doped semiconductor material. The insulating layer carries a number of electrodes arranged in the form of a matrix of lines and columns in which at least one line is present with at least two electrodes. The electrodes belonging to a line are electrically interconnected with each other. A buried channel is present in the substrate below each column and is doped opposite to the doping of the substrate. Each buried channel is connected, by way of a respective on-off switch, to the input of a voltage amplifier whose input capacitance is smaller than the capacitance of each individual buried channel and whose input resistance is so great that the time constant determined by the input resistance and the capacitance of a buried channel is greater than 10 nsec. The input of the voltage amplifier is electrically connected to an external terminal contact by way of at least one additional on-off switch.

5 Claims, 4 Drawing Figures

CHARGE INJECTION DEVICE OPTO-ELECTRONIC SENSOR

BACKGROUND OF THE INVENTION

1. Field of the Invention

The present invention relates to an opto-electronic sensor wherein at least one light-permeable electrically insulating layer is carried on a surface of a substrate made of doped semiconductor material. The insulating layer carries a number of electrodes arranged in a matrix of lines and columns, wherein at least one line is present with at least two electrodes. The electrodes of a respective line are interconnected with each other. A buried channel is present in the substrate below each column and doped oppositely to the doping of the substrate.

2. Description of the Prior Art

Opto-electronic sensors of the type mentioned above are well known in the art. Such a sensor is described, for example, in the publication "A Three Terminal Charge Injection Device" by Paul Jespers and Jean Marie Millet in the 1975 IEEE International Solid State Circuits Conference, Pages 28-29. In this article, a sensor is illustrated in a plan view in FIG. 5 on Page 29. The electrodes consist of polysilicon strips (Si gate strips) arranged line-by-line next to one another, and the buried channels (buried collector strips) extend transversely therebelow in the substrate. Each of the buried channels comprises an external terminal contact by way of which it is connected to ground by way of a resistance R (see FIG. 2). The mode of operation is such that, during the storage process, potential wells for the charge carriers produced by the incident light are produced below the electrodes, and that during the read out process, the charge carriers stored in these potential wells are received by the channels buried therebelow. The charged channel discharges via the resistance R. The output signal is taken off at the external terminal contact of the buried channel. The amplitude of the output signal is therefore low (smaller than one volt). Furthermore, this output signal is superimposed with timing pulses.

SUMMARY OF THE INVENTION

It is therefore the object of the present invention to provide a sensor of the type initially mentioned above which supplies great output signals and wherein the output signal is not superposed with a timing signal.

This object is achieved in such a way that each buried channel, by way of an associated on-off switch belonging only to that channel, is electrically conductively connected with an input of a voltage amplifier whose input capacitance is smaller than the capacitance of each buried channel and whose input resistance is so great that the time constant determined by the input resistance and the capacitance of a buried channel is greater than 10 nsec. The input of the voltage amplifier is electrically conductively connected with an external terminal contact by way of at least one additional on-off switch.

Advantageously, the associated on-off switches and the additional on-off switch comprise MIS transistors which are integrated upon the semiconductor substrate.

Advantageously, the voltage amplifier is realized as an operational amplifier.

To still further advantage, the voltage amplifier is integrated upon the semiconductor substrate.

Advantages of the invention comprise the fact that an output signal of desired magnitude may be taken off at the output of the voltage amplifier. The size of this signal merely depends upon the amplification of the voltage amplifier. The output signal is not superposed with timing and input pulses.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENT

Figure 1:
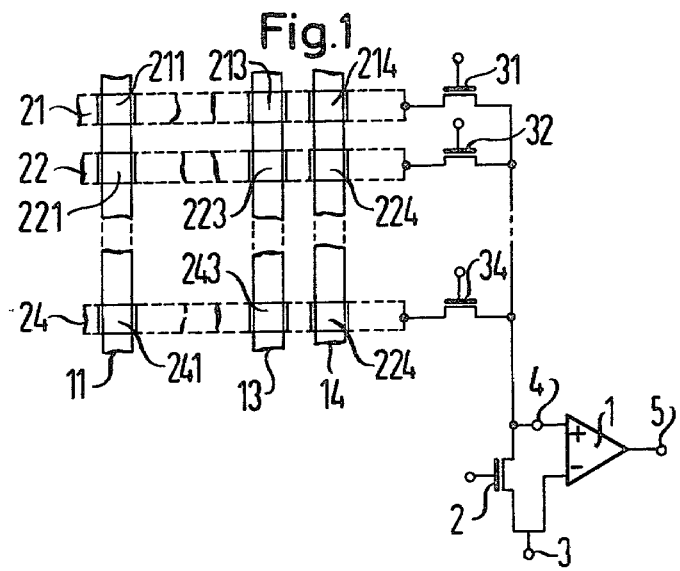
FIG. 1 illustrates, in principle, an opto-electronic sensor constructed in accordance with the present invention.

The opto-electronic sensor is illustrated in FIG. 1 as being formed in such a way that a light-permeable electrically insulating layer, such as silicon dioxide, is positioned upon a doped substrate, such as n-doped silicon. The substrate and the insulating layer have been omitted from the drawing for the purpose of simplicity and clarity.

The light-permeable electrically insulating layer carries a plurality of strips 11-14 made of electrically conductive material, such as polysilicon. Transversely of these strips, a plurality of buried channels 21-24 extend within the interior of the substrate. The buried channels 21-24 are doped opposite to the doping of the substrate.

The electrodes of the opto-electronic sensor are respectively formed by a plurality of surface pieces 211-244 that carried upon the strips 11-14. The surface pieces positioned upon a strip belong to a respective line. The buried channels 21-24 are electrically connected with an input 4 of a voltage amplifier 1 by way of a respective on-off switch 31-34. The input 4 of the voltage amplifier 1 is further electrically connected to a terminal contact 3, by way of an additional on-off switch 2. Of course, a p-doped substrate may also be used.

Figure 2:
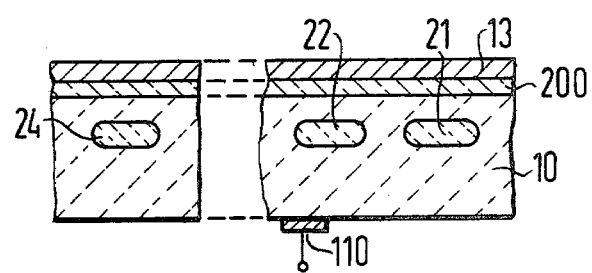
FIG. 2 shows a cross sectional view of the opto-electronic sensor along a strip.
Figure 3:
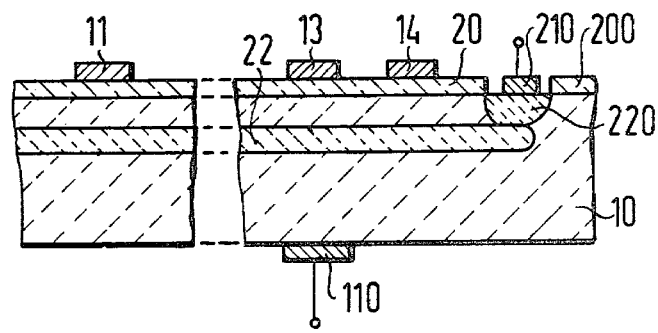
FIG. 3 shows a cross sectional view of the opto-electronic sensor along a buried channel.

FIG. 2 and FIG. 3 are cross sectional views of the opto-electronic sensor taken respectively along the strip 13 and the buried channel 22, both shown in the arrangement of FIG. 1. From these firgures can be seen the arrangement of a substrate 10, a light permeable electrically insulating layer 200 a substrate terminal 110, the buried channels 21, 22 and 24 and the stripes 11, 13 and 14. FIG. 3 additionally shows a typical connection between a buried channel 22 and a contact 210 by a doped zone 220, which is doped opposite to the doping of the substrate. Contact 210 may be connected to the source of a transistor 32. In the case of the transistor 32, shown in FIG. 1 being integrated upon the substrate, contact 210 may be omitted, if zone 220 is being used as the source or the drain of this transistor 32. The above described arrangements and connections are well known in the art.

Figure 4:
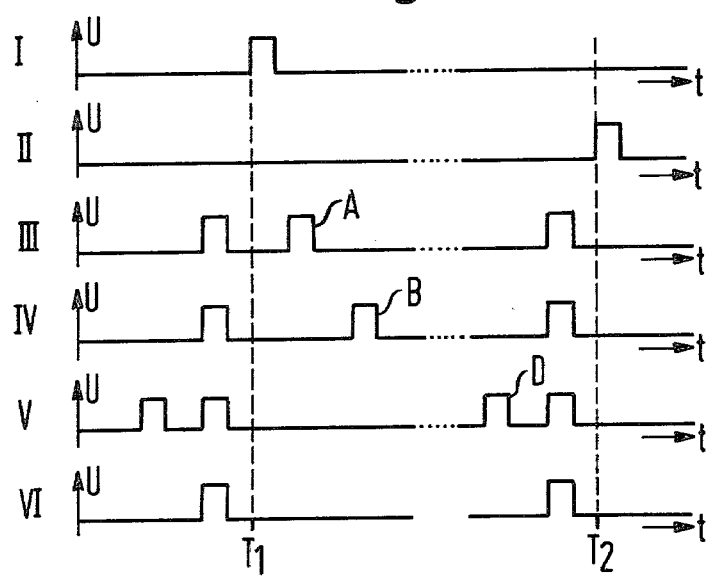
FIG. 4 is a pulse schedule during operation of the opto-electronic sensor as seen in six pulse diagrams I-VI.

The mode of operation of the opto-electronic sensor illustrated in FIG. 1 described in detail with the aid of FIG. 4. During the operation, the substrate terminal is placed at a fixed reference potential, for example ground, and the strips 11-14 are connected to a negative (positive) voltage, with respect to the reference potential, in the case of a n-doped (p-doped) substrate, during image reception. The buried channels were previously biased by way of a short time and simultaneous closing of the on-off switches 31-34 and the on-off switch 2, to have a reference voltage $U_R$ applied at the terminal contact 3. The reference voltage $U_R$ is to be selected equal to or negative (positive) the potential of the n-doped (p-doped) substrate, with respect to the reference potential. The read-out of the sensor is effected line-by-line. At the time $T_1$ (see FIG. 4) the line formed by the strip 13 is, for example, read out. For this purpose, the strip 13 is first placed for a short time at the reference potential by way of the voltage pulse. The diagram I therefore determines the time-voltage path of the voltages applied to the strip 13. During the width of the short-timed voltage pulse the charges collected below the electrodes 213, 223 and 243 are transferred into the respective buried channels 21, 22 and 24. Hereafter, the otherwise opened on-off switches 31-34 are closed for a short time, one after the other. Advantageously, MIS switch transistors are employed as the on-off switches.

The switch pulses are represented in a time association by way of the switch pulses A, B and D in the diagram lines III, IV and V. The switch pulse A is processed onto the control electrode of the switch transistor 31, the switch pulse B onto the control electrode of the switch transistor 32, and the switch pulse D onto the control electrode of the switch transistor 34. The polarity of these switch pulses depends on the switch transistors used. After the short time opening of the last associated on-off switch 34, a switch pulse E is applied to the control electrodes, simultaneously at all switches, therefore also at the on-off switch 2 which is also represented by a MIS switch transistor, and thus all switches are closed for a short time. The buried channels are therefore biased for a short time to the reference voltage $U_R$. The diagram line VI illustrates the switch pulses which are to be applied to the control electrode of the on-off switch 2.

After all on-off switches are closed again, a pulse is shortly applied to another strip at a time $T_2$, for example to the strip 14, and this electrode is brought to the reference potential during its operation. The diagram line II illustrates the time voltage path at the strip 14. Due to the short time pulse, a new read-out process is triggered, and the process extends as previously described. The output signals are taken off at the output 5 of the amplifier 1.

Although we have described our invention by reference to particular illustrative embodiments thereof, many changes and modifications of the invention may become apparent to those skilled in the art without departing from the spirit and scope of the invention. We therefore intend to include with the patent warranted hereon all such changes and modifications as may reasonably and properly be included within the scope of our contribution to the art.

We claim:

1. An opto-electronic sensor comprising:
  a doped semiconductor substrate;
  at least one light-permeable electrically insulating layer carried on said substrate;
  a matrix of electrodes arranged in lines and columns on said insulating layer, the electrodes of a respective line electrically connected together;
  a plurality of buried channels, each below a respective column electrode in said substrate and doped oppositely to said substrate and each having a capacitance;
  a voltage amplifier including an input connected to said buried channels and including an input capacitance which is less than the capacitance of an individual buried channel and an input resistance such that the time constant of the input resistance and the capacitance of the respective buried channel is greater than 10 nsec;
  a plurality of on-off switches interposed between said buried channels and said amplifier; and
  an additional on-off switch connecting said input of said amplifier to an external terminal contact.

2. An opto-electronic sensor according to claim 1, wherein all of said on-off switches are field effect switch transistors each including semiconductor material, an insulator on the semiconductor material and a metal electrode on the insulator.

3. An opto-electronic sensor according to claim 2, wherein each of said field effect switch transistors are integrated upon said substrate, with said substrate forming the semiconductor material of each transistor.

4. An opto-electronic sensor according to claim 1, wherein said amplifier is integrated upon said substrate.

5. An opto-electronic sensor according to claim 1, wherein all of said on-off switches are field effect transistors integrated on said substrate and said amplifier is integrated on said substrate.

* * * * *